United States Patent [19]

Bertin et al.

[11] Patent Number: 5,502,667
[45] Date of Patent: Mar. 26, 1996

[54] INTEGRATED MULTICHIP MEMORY MODULE STRUCTURE

[75] Inventors: Claude L. Bertin; Wayne J. Howell, both of South Burlington; Erik L. Hedberg, Essex Junction; Howard K. Kalter, Colchester; Gordon A. Kelley, Jr., Essex Junction, all of Vt.

[73] Assignee: International Business Machines Corporation, Armonk, N.Y.

[21] Appl. No.: 120,876

[22] Filed: Sep. 13, 1993

[51] Int. Cl.$^6$ .................................................. G11C 5/02
[52] U.S. Cl. .............................. 365/51; 365/63; 257/686; 257/724; 361/735; 361/728
[58] Field of Search .................................. 365/51, 63, 52; 257/686, 724, 777; 361/684, 735, 728

[56] References Cited

U.S. PATENT DOCUMENTS

| | | | |
|---|---|---|---|
| 2,907,926 | 10/1959 | Slack | 317/101 |
| 3,029,495 | 4/1962 | Doctor | 29/155.5 |
| 3,065,384 | 11/1962 | Sprude | 317/101 |
| 3,070,729 | 12/1962 | Heidler | 317/100 |
| 3,139,559 | 6/1964 | Heidler | 317/101 |

(List continued on next page.)

FOREIGN PATENT DOCUMENTS

| | | |
|---|---|---|
| 0075945 | 9/1982 | European Pat. Off. . |
| 206696 | 4/1986 | European Pat. Off. . |
| 2645681 | 4/1989 | France . |
| 58-103149 | 1/1983 | Japan . |
| 59-205747 | 12/1984 | Japan . |

(List continued on next page.)

OTHER PUBLICATIONS

Future Generations Computer Systems, vol. 4, No. 2, Sep. 1988, Amsterdam NL —Kurokawa et al. "3–D VLSI Technology in Japan and an Example: a Syndrome Decoder for Double Error Correction".

Stolle, "Edge–Mounted Chip Assembly For Microprocessor", IBM Technical Disclosure Bulletin, vol. 23, No. 2, pp. 581–582, Jul. 1980.

Carson, "Unconventional focal–plane architecture (FPA)", SPIE, vol. 225, IR Image Sensor Tech., pp.34–37, 1980.

Parks, "Batch–Fabricated Three–Dimensional Planar Coaxial Interconnections or Microelectronic Systems," IEEE Trans. on Computers, vol. C–20, No. 5, pp. 504–511, May 1971.

Agusta et al., "High Density Packaging of Monolithic Circuits", IBM Technical Disclosure Bulletin, vol. 10, No. 7, p. 890, Dec. 1967.

Bertin et al., "Evaluation of a 3D Memory Cube System", IEEE, pp. 12–15, 1993.

Primary Examiner—David C. Nelms
Assistant Examiner—Huan Hoang
Attorney, Agent, or Firm—Heslin & Rothenberg

[57] ABSTRACT

An integrated multichip memory module structure and method of fabrication wherein stacked semiconductor memory chips are integrated by a controlling logic chip such that a more powerful memory architecture is defined with the appearance of a single, higher level memory chip. A memory subunit is formed having N memory chips with each memory chip of the subunit having M memory devices. The controlling logic chip coordinates external communication with the N memory chips such that a single memory chip architecture with N×M memory devices appears at the module's I/O pins. A preformed electrical interface layer is employed at one end of the memory subunit to electrically interconnect the controlling logic chip with the memory chips comprising the subunit. The controlling logic chip has smaller dimensions than the dimensions of the memory chips comprising the subunit. A lead frame, having an inner opening extending therethrough, is secured to the electrical interface layer and the controlling logic chip is secured to the electrical interface layer so as to reside within the lead frame, thereby producing a dense multichip integrated circuit package. Corresponding fabrication techniques include an approach for facilitating metallization patterning on the side surface of the memory subunit.

26 Claims, 5 Drawing Sheets

U.S. PATENT DOCUMENTS

| | | | |
|---|---|---|---|
| 3,152,288 | 10/1964 | Mittler | 317/99 |
| 3,370,203 | 2/1968 | Kravitz et al. | 317/101 |
| 3,746,934 | 7/1973 | Stein | 317/101 |
| 3,748,479 | 7/1973 | Lehovec | 250/208 |
| 4,520,427 | 5/1985 | Brotherton et al. | 361/389 |
| 4,525,921 | 7/1985 | Carson et al. | 29/577 |
| 4,551,629 | 11/1985 | Carson et al. | 250/578 |
| 4,612,083 | 9/1986 | Yasumoto et al. | 156/633 |
| 4,638,348 | 1/1987 | Brown et al. | 357/74 |
| 4,646,128 | 2/1987 | Carson | 357/74 |
| 4,706,166 | 11/1987 | Go | 361/403 |
| 4,727,410 | 2/1988 | Higgins, III | 357/74 |
| 4,764,846 | 8/1988 | Go | 361/388 |
| 4,801,992 | 1/1989 | Golubic | 357/40 |
| 4,818,728 | 4/1989 | Rai et al. | 437/209 |
| 4,833,568 | 5/1989 | Berhold | 361/383 |
| 4,862,249 | 8/1989 | Carlson | 357/80 |
| 4,868,712 | 9/1989 | Woodman | 361/388 |
| 4,879,258 | 11/1989 | Fisher | 437/225 |
| 4,894,706 | 1/1990 | Sato et al. | 357/72 |
| 4,901,136 | 2/1990 | Neugebauer et al. | 357/75 |
| 4,902,641 | 2/1990 | Koury, Jr. | 437/62 |
| 4,926,241 | 5/1990 | Carey | 357/75 |
| 4,956,746 | 9/1990 | Gates, Jr. et al. | 361/385 |
| 4,983,533 | 1/1991 | Go | 437/7 |
| 5,016,138 | 5/1991 | Woodman | 361/381 |
| 5,019,943 | 5/1991 | Fassbender et al. | 361/396 |
| 5,019,946 | 5/1991 | Eichelberger et al. | 361/414 |
| 5,051,865 | 9/1991 | Kato | 361/386 |
| 5,064,771 | 11/1991 | Solomon | 437/3 |
| 5,071,792 | 12/1991 | VanVanno et al. | 437/227 |
| 5,091,331 | 2/1992 | Delgado et al. | 437/62 |
| 5,162,254 | 11/1992 | Usui et al. | 437/63 |
| 5,266,833 | 11/1993 | Capps | 257/690 |
| 5,347,428 | 9/1994 | Carson et al. | 257/686 X |

FOREIGN PATENT DOCUMENTS

| | | |
|---|---|---|
| 61-35547 | 6/1986 | Japan . |
| 61-168951 | 11/1986 | Japan . |
| 62-16535 | 5/1987 | Japan . |
| 63-186457 | 6/1988 | Japan . |
| 1-53440 | 9/1989 | Japan . |
| 2-36554 | 1/1990 | Japan . |
| WO89/04113 | 7/1989 | WIPO . |

INTEGRATED MULTICHIP MEMORY MODULE STRUCTURE

TECHNICAL FIELD

The present invention relates in one aspect to high density electronic packaging which permits optimization of device performance within a given volume. In another aspect the invention relates to an integrated multichip memory module structure and method of fabrication wherein stacked semiconductor memory chips are integrated by controlling logic such that a more powerful memory architecture having the functions of a single, higher level memory chip is presented to external circuitry.

BACKGROUND ART

Conventionally, integrated circuit devices, such as memory devices, have been made from wafers of semiconductor material which include a plurality of integrated circuits. After a wafer is made, the circuits are separated from each other by dicing the wafer into small chips. Thereafter, the chips are bonded to carriers of various types, electrically interconnected by wires to leads and packaged.

By way of improvement, high density electronic packaging modules having multiple semiconductor chips have become popular. For example, U.S. Pat. Nos. 4,525,921 and 4,646,128 by Carson et al. disclose structure and fabrication techniques for producing one type of high density electronic processing package. Each of these patents describes a semiconductor chip stack consisting of multiple integrated circuit chips adhesively secured together. A metallized pattern is provided on one of the side surfaces of the stack for electrical connection of the stack to external circuitry. This metallization pattern typically includes both individual contacts and bused contacts. The stack is positioned on an upper surface of a substrate such that electrical contact is made between the stack metallization pattern and a substrate surface metallization pattern.

Traditionally, computer memory systems are assembled from many types of memory chips, such as, DRAMs, SRAMs, EPROMs and EEPROMs. The number of storage devices per memory chip technology generation varies but increases over time with more devices per chip being delivered with each succeeding generation, thereby providing greater memory capacity. When a next generation memory chip becomes available, the number of chips needed to make a given memory system is correspondingly reduced. With fewer memory chips needed, the resultant memory system becomes physically smaller.

Next generation DRAM memory chips have traditionally increased by 4×the number of bits compared with current generation technology. For example, assume that the current generation of memory chips comprises 16 megabit (Mb) chips, then by industry standards the next generation will comprise 64 Mb memory chips. This 4× advancement from one generation of memory chips to the next generation is traditionally accomplished only with corresponding advancement in semiconductor tool and process technologies, for example, sufficient to attain a 2× reduction in surface geometries. Due to this interrelationship, a significant interval of time can pass between generations of memory chips. Therefore, a genuine improvement in memory system design and fabrication would be attained if current generation memory chips could be packaged to have the same functions and physical dimensions of an anticipated, next generation memory chip. The integrated multichip memory module structure and fabrication techniques presented herein provide such an improvement.

DISCLOSURE OF INVENTION

Briefly summarized, the present invention comprises in one aspect an integrated multichip memory module which appears to external, i.e., next level of packaging, circuitry to have a single memory chip architecture. The memory module includes a memory subunit having N memory chips wherein N≧2. Each memory chip of the memory subunit has M memory devices wherein M≧2, along with two substantially parallel planar main surfaces and an edge surface. At least one planar main surface of each memory chip is coupled to a planar main surface of an adjacent memory chip of the memory subunit such that the subunit has a stack structure. Logic means is associated with the memory subunit and electrically connected to each of the N memory chips for coordinating external communication with the N memory chips of the memory subunit such that an integrated memory structure exists that emulates a single memory chip architecture with N×M memory devices.

In an enhanced aspect, an integrated multichip memory module is provided wherein N memory chips, each having M memory devices, are integrated in an architecture which functionally emulates a single memory chip architecture with N×M memory devices. Each memory chip includes two substantially parallel planar main surfaces and an edge surface. The N memory chips are stacked together to form a subunit having at least one side surface and an end surface. The at least one side surface of the subunit is defined by the edge surfaces of the N memory chips. The end surface of the subunit is parallel to the planar main surfaces of the N memory chips forming the subunit. At least some of the N memory chips include transfer metallurgy extending from the chip's input/output (I/O) pads to the at least one side surface of the subunit. A first metallization pattern is disposed on the subunit's at least one side surface to electrically connect with the transfer metallurgy extending thereto. An electrical interface layer, disposed adjacent to the end surface of the subunit, also has two substantially parallel planar main surfaces and an edge surface. One of the substantially parallel planar main surfaces of the electrical interface layer is coupled to the end surface of the subunit. The edge surface of the electrical interface layer aligns with the at least one side surface of the subunit. The electrical interface layer includes a second metallization pattern disposed therethrough which electrically connects with the first metallization pattern on the at least one side surface of the subunit. A logic chip is coupled to the electrical interface layer and electrically connected to the second metallization pattern such that the logic chip is electrically connected to the memory chips through the first and second metallization patterns. The logic chip includes logic means for coordinating external communication with the N memory chips of the subunit such that an integrated memory structure exists which functionally emulates a single memory chip architecture with N×M memory devices.

In another embodiment, a multichip integrated circuit package is defined having a plurality of semiconductor chips of similar dimensions coupled together in a stack having an end surface and at least one edge surface. A lead frame is secured to the stack at its end surface. The lead frame includes an inner opening extending therethrough such that a portion of the stack's end surface remains exposed. A semiconductor chip of smaller dimensions than the similar dimensions of the plurality of semiconductor chips forming the stack is also provided. This semiconductor chip is sized so as to reside within the inner opening of the lead frame and be secured to the portion of the stack's end surface remaining exposed. Finally, metallurgy means are provided for electrically interconnecting the plurality of semiconductor chips forming the stack, the semiconductor chip of smaller dimensions and the lead frame such that a dense multichip integrated circuit package is defined from semiconductor chips having different dimensions.

Fabrication processes corresponding to the various embodiments of the multichip integrated circuit module/ package are also described. A particularly novel process is presented for facilitating side surface metallization of a plurality of semiconductor chip subassemblies using a sacrificial material disposed between the subassemblies.

A number of advantages are inherent in an integrated multichip memory module structure and fabrication approach in accordance with the invention. For example, the resultant structure can emulate a next generation memory chip using readily available current generation memory chips. A packaged module can have physical dimensions smaller than industry standards for a next generation memory chip package. Wiring interfaces between existing and next generation buses can be contained in a preformed electrical interface layer which can be manufactured and tested separately. Logic chip transfer metallurgy to a side of the structure is eliminated, thereby also eliminating any special processing and testing for the logic chip. Testing and burn-in of the logic chip, memory chip subassembly and preformed electrical interface layer can be separately conducted, thus identifying a potential defect at a lower level assembly. The controlling logic chip can reside entirely within an inner opening in the lead frame. Further, any number of semiconductor chips can be employed within a module's stack. The number employed depends upon the memory chip architecture selected and the memory module architecture desired. The logic control function can be allocated over one or more chips fitting within the lead frame opening on the preformed electrical interface layer. Decoupling capacitors and resistors can also be placed within the lead frame opening and attached to the electrical interface layer.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

An integrated multichip memory module in accordance with the invention can be implemented using any one of a variety of available memory chip architectures. By way of example, the following discussion assumes that four 16 Mb DRAMs are to be assembled in a memory stack. This multichip memory module emulates exactly a next generation memory chip, i.e., a 64 Mb DRAM. This integrated, function is accomplished by associating a control logic chip with the stack of four memory chips. The resultant module of four 16 Mb DRAMs plus logic chip can be sized to fit into an industry standard 64 Mb package, or if desired, a smaller package. Compared with single memory chips, there are significant processing, manufacturability and cost advantages to this integrated multichip memory module structure in accordance with this invention.

Figure 1:
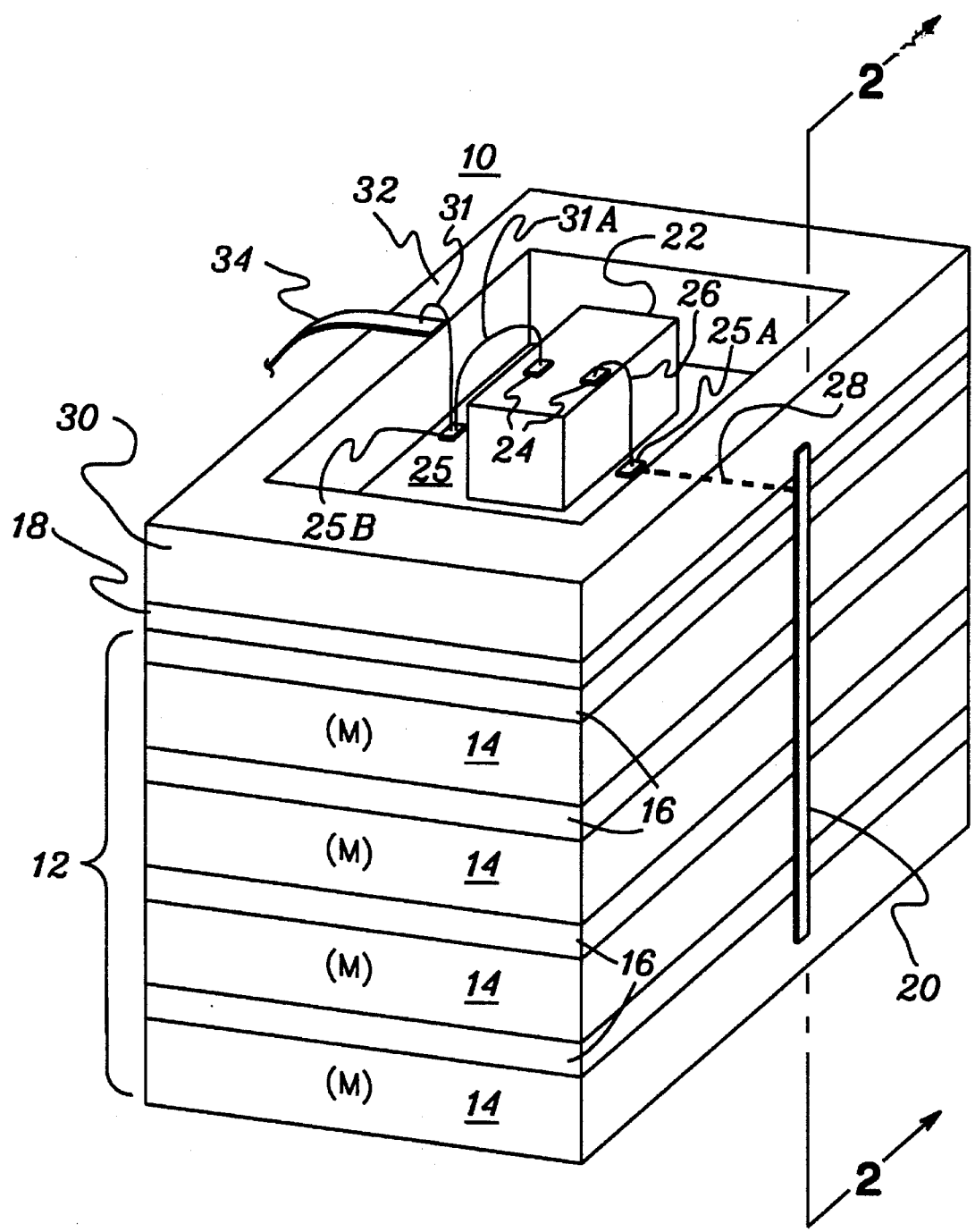
FIG. 1 is a perspective view of one embodiment of an integrated multichip memory module pursuant to the present invention.

In the figures, which are not drawn to scale for ease of understanding, the same reference numbers are throughout multiple figures to designate the same or similar components. FIG. 1 depicts one embodiment of the integrated multichip memory module, generally denoted 10, pursuant to the invention. In this embodiment, four memory chips (M) 14 are connected in a stack 12 having the shape of a rectangular parallelepiped. Each memory chip 14 has two substantially parallel planar main surfaces and an edge surface with at least one planar main surface of each memory chip being coupled to a planar main surface of an adjacent memory chip in the stack 12. Multiple layers 16 (see FIG. 5) are disposed between adjacent memory chips 14. Each layer 16 contains appropriate transfer metallurgy 15 (FIG. 2) and insulation layers 17A to provide electrical connection to the storage devices of the respective memory chip. An adhesive layer 17 (FIG. 5) such as a Thermid® polymer (TM of National Starch and Chemical Co.) secures adjacent memory chips 14 together. Disposed along at least one end surface of stack 12 is a preformed electrical interface layer 18 which has a metallization pattern 28 therethrough.

Figure 2:
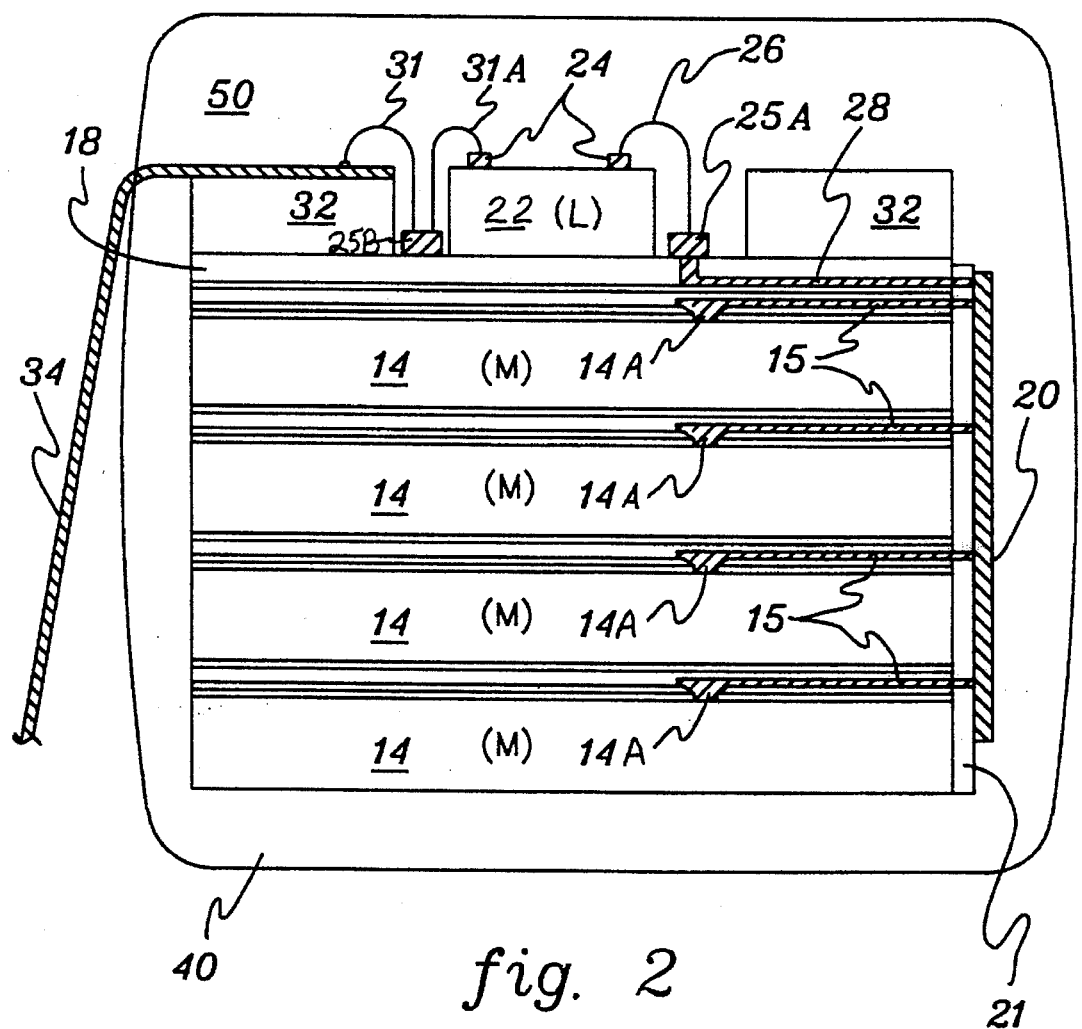
FIG. 2 is a cross-sectional elevational view of the integrated multichip memory module of FIG. 1 taken along lines 2—2.

In one embodiment, layer 18 comprises a Upilex (or alternative insulator) flex layer wherein plated throughholes or vias interconnect some thin-film wiring on a top surface of layer 18 and thin-film wiring on a bottom surface of the layer (see, e.g., FIG. 2). (There is other top surface thin-film wiring 25B which provides for the interconnection of the logic chip 22 and lead frame 32.) Together these wirings comprise metallization pattern 28, only one thin-film wire is shown in phantom in FIG. 1. The metallization pattern within electrical interface layer 18 routes, for example, 16 Mb wiring from a control logic chip 22 to another metallization pattern 20 disposed on an insulator 21 on at least one side surface of stack 12. Only one type of metallization pattern 20 is depicted in FIG. 1 for clarity. T connects are employed at the interface between metallization pattern 28 and metallization pattern 20. If desired, multiple side surfaces of stack 12 could accommodate buses or other wiring connections to the semiconductor memory chips (M). Standard transfer metallurgy 15 is brought out and electrically connected to metallization pattern 20 on the at least one side surface of stack 12. Again, interconnection of transfer metallurgy 15 and metallization pattern 20 is achieved using T-connects.

One feature to note is that control logic chip 22 has dimensions smaller than the common dimensions of memory chips 14 forming stack 12. This size difference allows control logic chip 22 to be placed within a center opening 25 in a lead frame 32 (comprised of the lead 34 and the insulation/adhesive layer 30) disposed above preformed electrical interface layer 18. Lead frame 32, which surrounds logic chip 22, contains multiple leads, with only one lead 34 being shown. External circuitry connects to module 10 via, for example, a conventional lead 34. Standard wirebond technology is used to interconnect the logic chip 22 and memory chip stack 12 to the lead 34. In practice, a wire 31 is used to interconnect the lead and a contact pad 25B on the surface of interface layer 18. A second wire 31A interconnects contact pad 25B and I/O pad 24 on control logic chip 22. (An alternative interconnection technique would have wire 31 interconnect lead 34 and logic chip I/O 24.) Lastly, wire 26 interconnects I/O pad 24 on control logic chip 22 and contact pad 25A on the surface of interface layer 18. As noted, contact pad 25A on interface layer 18 comprises part of metallization pattern 28. Metallization pattern 28 is connected to metallization pattern 20 on at least one side surface of stack 12. In this first embodiment, wires 26, 31, and 31A connect to arrays of leads 34 and contact pads 25A and 25B. Only three interconnecting wires are depicted in FIG. 1 and FIG. 2. In actual implementation, there is a plurality of interconnections between logic chips 22, pads 25A and 25B on interface layer 18, and lead frame 32 including wires 26, 31, and 31A.

For this example, the 64 Mb and 16 Mb wiring connections are also shown in FIG. 2. In this figure, wires 31 & 31A and lead 34 comprise 64 Mb wiring, while wires 26, 28 and 20 comprise 16 Mb wiring. Further, thin-film 16 Mb wiring 15 is shown above the top planar surface of each memory chip 14. This wiring 15 represents the transfer metallurgy from each memory chip 14 to chip I/O 14A to metallization pattern 20 on the side surface of stack 12. A plurality of thin-film wirings would typically connect each memory chip to the side surface metallization pattern. FIG. 2 also shows a completed package wherein an encapsulant 40 surrounds the multichip memory module. Encapsulant 40 can comprise any conventional encapsulating material. One feature to note in this example is that external wiring (64 Mb) to integrated multichip memory module 10 is separate from intra-module wiring, i.e., 16 Mb wiring.

As noted, when packaged the dimensions of an integrated multichip memory module 10 pursuant to the invention are such that the module will fit within the target physical dimensions for a next generation memory chip. This is in part accomplished by the provision of a logic chip 22 which can reside within center opening 25 in lead frame 32. Very little area is required to implement the logic circuits described below. Therefore, extra area within logic chip 22 can be used for customer-specific applications. These applications include SRAM, psuedostatic RAM, error correction code, memory handshaking, and array built-in self-testing. Inclusion of such applications on logic chip 22 could dramatically improve performance of the chip for customer-specific uses.

The basic method to "fit" an integrated multichip memory module, comprised of current generation chips, e.g., 16 Mb, into a plastic package that is smaller in volume than the initial next generation, e.g., 64 Mb, industry standard (JEDEC) package is to trade plastic encapsulation material for silicon, i.e., multiple semiconductor chips. Historically initial next generation chip packaging grows in length and width proportional to next generation chip size. Plastic package height, however, has remained constant through several memory chip technology generations. For a given chip technology generation, e.g., 16 Mb, as the fabrication processes and manufacturing tool technology mature there is usually a complementary reduction in chip length and width, i.e., the chip size shrinks as the technology matures, with a commensurate reduction in plastic packaging size. In general, this shrinking proceeds to the point where the next generation chip approximately equals the size of the previous, fully mature, generation. Therefore a multichip memory module that emulates a next generation technology in accordance with the present invention can be readily fabricated to have smaller length and width than the initial single next generation memory chip. The height of the multichip memory module plastic package can exactly meet the next generation JEDEC height standards by reducing the thickness of the plastic encapsulant and/or reducing the thickness of the memory chips comprising the multichip module. Thereby resulting in a smaller plastic package compared with single chip next generation packaging.

Figure 3:
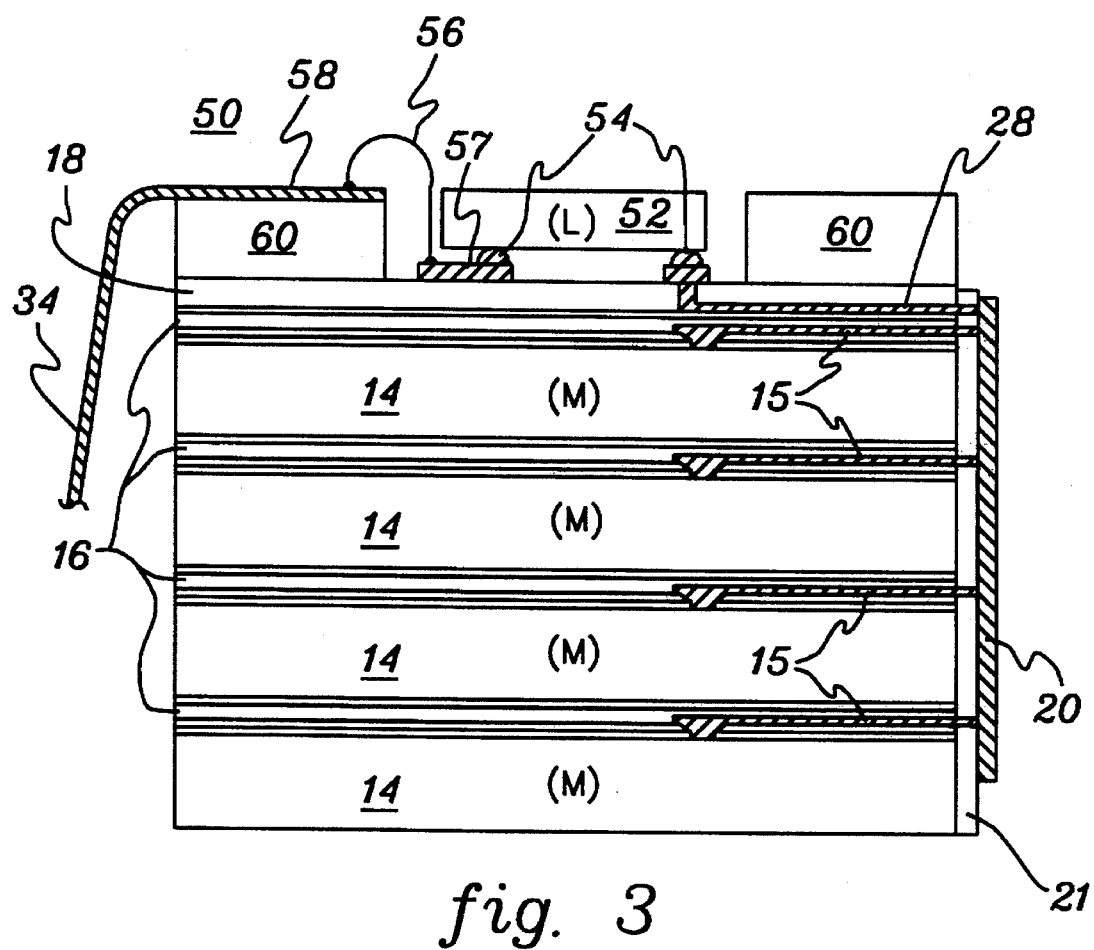
FIG. 3 is a cross-sectional elevational view of an alternate embodiment of an integrated multichip memory module in accordance with the present invention.

FIG. 3 depicts another embodiment of an integrated multichip memory module 50 in accordance with the invention. In this embodiment, stack 12 with multiple semiconductor chips 14 is substantially the same as to that described above in connection with FIGS. 1 & 2. In addition, preformed electrical interface layer 18 is at least disposed above the upper surface of the top-most memory chip in the stack. A point of difference with module 10 of FIG. 1, however, comprises a control logic chip 52 having an array of contact pads on its bottom surface, along with the electrical connections made thereto. As shown, solder bumps 54 are employed to connect electrically and mechanically connect chip 52 to memory chips 14 via the metallurgy of layer 18 and the stack's at least one side surface metallurgy. Chip 52 connects to the lead 58 through, for example, a 64 Mb thin-film bus 57 on the upper surface of layer 18, using wire 56. The lead frame 60 provides the means to interconnect to the next packaging level.

As with the initial embodiment, lead frame 60 has an inner opening that accommodates the controlling logic chip, which is smaller than the semiconductor chips 14 forming stack 12. Standard wirebond technology is used to electrically connect the lead frame 60 and the metallurgy pad 57 on interface layer 18. Metallization pattern 20, disposed on an insulator 21, is used to interconnect electrically the memory chips in stack 12 and the logic chip 52. T-connects are used to interconnect transfer metallurgy 15 with metallization 20 and interface layer 18 metallization 28 with metallization 20. The resultant structure is injection molded with a protective encapsulant 40 such as that depicted in FIG. 2. One feature to again note is the dense stacking achieved in part through the provision of a reduced size logic chip that can reside within a center opening in the lead frame. This particular stacking configuration could obviously be generalized for other integrated circuit chip stacks. For example, one or more chips could be attached to the memory stack in a manner similar to that described herein. Further, the number of semiconductor chips in the stack could be modified as needed for a particular application.

An overview of one embodiment of a control logic circuit in accordance with the present invention is depicted in FIG.

4. This logic circuit, denoted 70, receives address and control inputs 72 from a memory controller (not shown) or other external processing unit. Logic circuit 70 is designed to industry standards for a next generation single memory chip input timings. For example, if the semiconductor memory chips in the stack comprise 64 Mb memory chips, then logic 70 would have the same I/O characteristics as a 256 Mb single memory chip. A voltage regulator 71 can be provided to allow powering of logic circuit 70 by either a five volt or three volt source. This suggests another feature of the invention. If desired, the logic chip could be powered at a different voltage level than the supply provided to the chip stack 84.

As a further example, four 4 Mb×4, 12/10 addressable memory chips are assumed to define stack 84. Each chip provides ¼ of a 64 Mb memory array. Assume further that a desired product is a 13/11 addressable, 16 Mb×4 array. With such an input, 13 bits enter address buffers 74. Thus, a 12 bit signal is passed from address buffer 74 to stack 84. During RAS time, one bit of the incoming 13 bits is split off and fed to a RAS decoder 86. Similarly, during CAS time, one bit of the received 11 bit signal is split off and fed to a CAS decoder 88. RAS and CAS timing pulses are received by a RAS enable buffer 76 and a CAS enable buffer 78, respectively, from module input 72.

Output from buffer 76 is a RASP signal comprising a RAS pulse, positive active high. This pulse is output from RE buffer 76 whenever the buffer detects its input going low. The signal is also fed to address buffer 74 to enable/disable the address buffers. Similarly, output CASP from CE buffer 78 is fed to a write enable buffer 80 to provide enable/disable control. Output from RAS enable buffer 76 and one address from address buffer 74 are fed to RAS decoder 86, which outputs two signals RE1 and RE2. Together, these signals select two of the four memory chips in stack 84. Only signal RE1 or signal RE2 has an applied voltage (i.e., is in active state) based upon the inputs received by RAS decoder 86.

Note that the approach to selecting a particular semiconductor chip is dependent upon the architecture employed. For example, if an 11/11 4 MB×4 semiconductor chip is used then two bits would be required for input to the RAS decoder. Upon receipt of an appropriate RASP pulse one of the four semiconductor chips would be directly selected by the RAS decoder. In such a case, the CAS decoder output would be connected to all four chips in stack 84. However, with 12/10 16 Mb chips, CAS decoder 88 will need to output one of two signals CE1 and CE2. Signals CE1 and CE2 are fed back to the memory chips of stack 84 in an interleaved fashion relative to signals RE1 and RE2. Thus, at RAS time, two of the four semiconductor chips are selected and at CAS time one of the two previously selected chips is identified as containing the particular address to be accessed by the 12/10 address signal forwarded from address buffer 74 to the stack. The appropriate four data bits from the selected memory chip will then be accessed and output via off chip driver 98 to a main bus DQ (0–3).

A comparator is employed as a CBR detect circuit 90 to identify the JEDEC standard timing of when a CAS pulse occurs before a RAS pulse. Such an ordering occurs when the memory controller (or system controller) directs that a memory refresh should occur. A RAC counter 94 counts each CBR output pulse and sequentially directs which semiconductor chip in stack 84 is to be refreshed. Thus, sequential refreshing of semiconductor chips is ensured irrespective of which chip signal RAS 13 and signal CAS 11 identify. A self-time refresh (STR) circuit 92 also receives output from CAS before RAS detect 90. This circuit controls initiation of a "sleep mode" whereby if the CAS signal appears before the RAS signal and, for example, is held active for at least 100 microseconds, sleep mode for all four 16 Mb ×4 semiconductor chips are invoked via RAS decoder 86 and CAS decoder 88.

In addition to write enable buffer 80, an output enable buffer 82 receives pulse signals from said external source. Outputs from buffers 76, 78, 80 and 82 are fed to a conventional tristate control 96 which feeds off chip driver (OCD) 98 and a data in buffer 100. Tristate control 96 deselects the data in buffer 100 when an output is being driven to bus DQ (0–3) or, alternatively, turns off OCD 98 when data is being received at buffer 100.

Note that logic circuit 70 is in addition to the standard logic and timing circuits inherent on the 16 Mb semiconductor memory chips in stack 84. Logic circuit 70 comprises a control logic circuit designed to emulate a single semiconductor memory chip, in this case a 64 Mb chip. Thus, for a particular implementation, logic circuit 70 is designed with two constraints. The first constraint comprises the known architecture of the selected memory chips in the stack, and the second constraint comprises the JEDEC standard operation of a 64 Mb chip. Further, note that logic circuit 70 can be employed in different memory I/O configurations. For example, if for a given application a by eight bit output is desired, then two chips, each simultaneously activated by control circuit 70 (each by four), can be coupled together to mimic the desired by eight architecture. In addition, logic circuit 70 could implement various additional logic functions as desired. Such functions might include ECC, boundary scan, toggle mode, additional memory for sparing, storage devices, timing delays, memory control, data handling, write per bit, toggle mode, I/O buffering, address re-configuring or active terminating.

Fabrication of an integrated multichip memory module in accordance with this invention is analogous in many respects to the fabrication approach presented in co-pending U.S. patent application entitled "Polyimide-Insulated Cube Package of Stacked Semiconductor Device Chips," Ser. No. 08/080,453, filed on Jun. 21, 1993, which is assigned to the same assignee as the present application, and which is hereby incorporated herein by reference.

Figure 5:
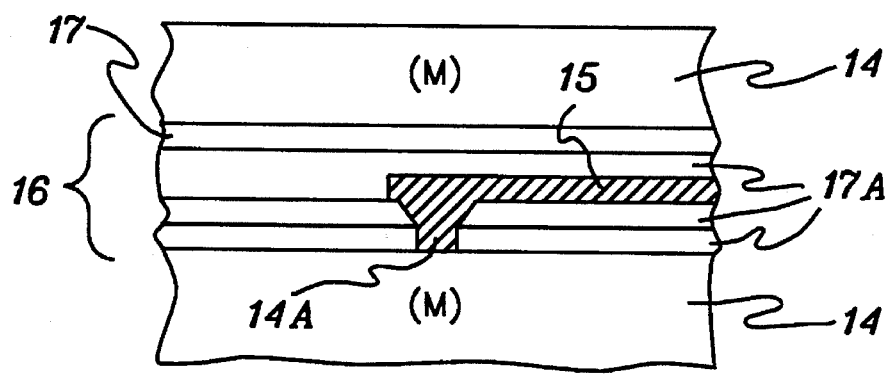
FIG. 5 is an enlarged partial cross-section of one embodiment of the layers disposed between the two opposing planar surfaces of adjacent memory chips within an integrated multichip memory module pursuant to the present invention.
Figure 4:
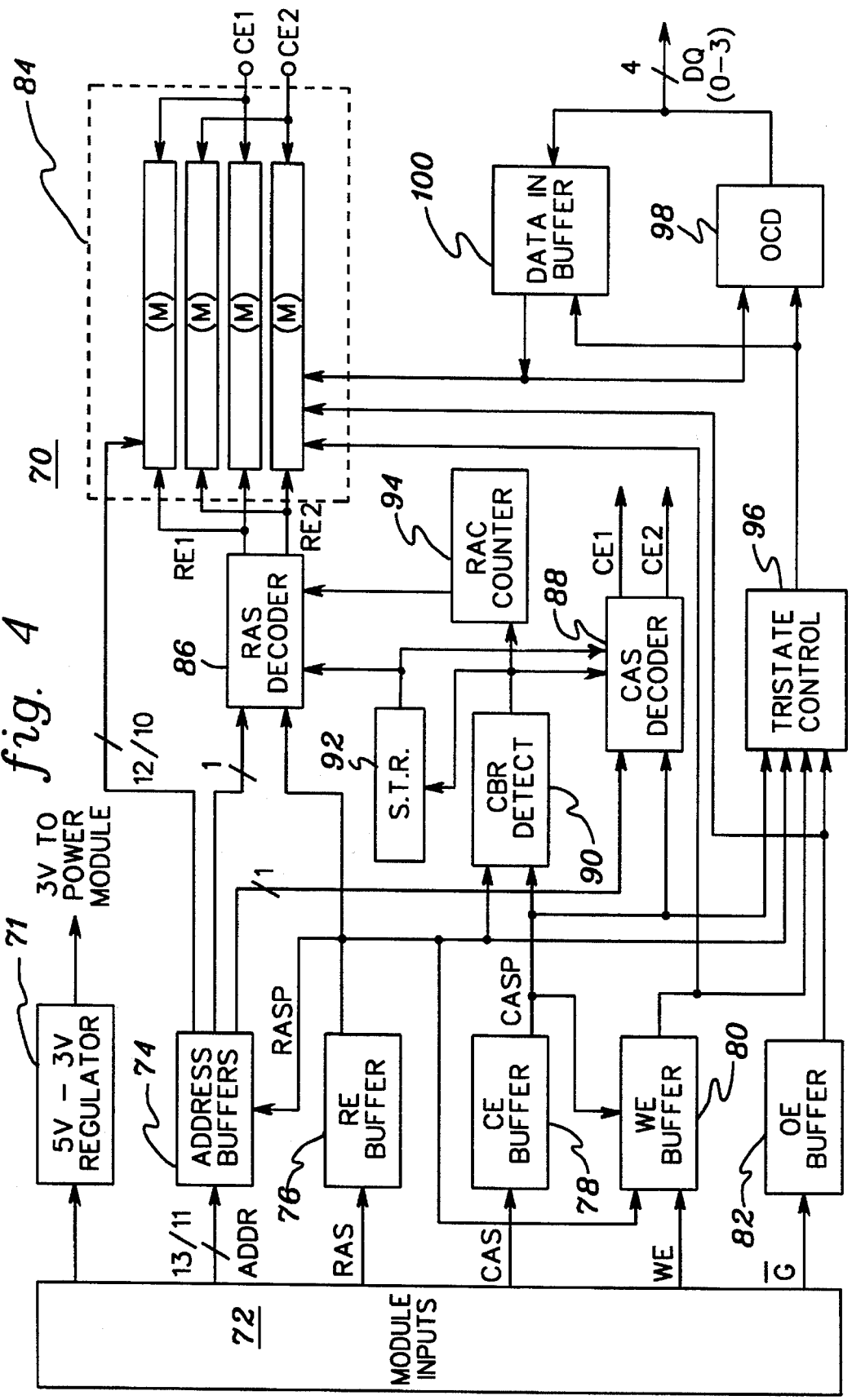
FIG. 4 is a block diagram schematic of one embodiment of a controlling logic circuit for the multichip memory modules of FIGS. 1–3.

FIG. 5 depicts an enlarged cross-section of two adjacent memory chips in an integrated multichip memory module pursuant to the present invention. As noted previously, layers 16 include transfer metallurgy 15, appropriate insulating layers 17A and an adhesive layer 17 to secure adjacent memory chips together. As a specific example, transfer metallurgy 15 could comprise titanium/aluminum/copper, and would be surrounded by multiple insulating layers 17A, for example, polyimide. Finally, an adhesive layer 17 is disposed upon these layers to allow adjacent chips to be secured together. A preferred commercially available adhesive is the above-referenced Thermid®. Obviously, other interchip layer configurations could be employed by one skilled in the art without departing from the novel concepts set forth herein.

Figure 6:
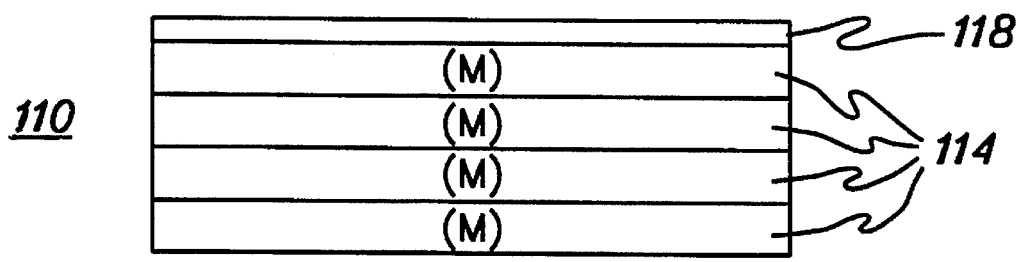
FIG. 6 is an elevational view of one embodiment of a multichip memory subunit and electrical interface layer subassembly in accordance with the present invention.
Figure 7:
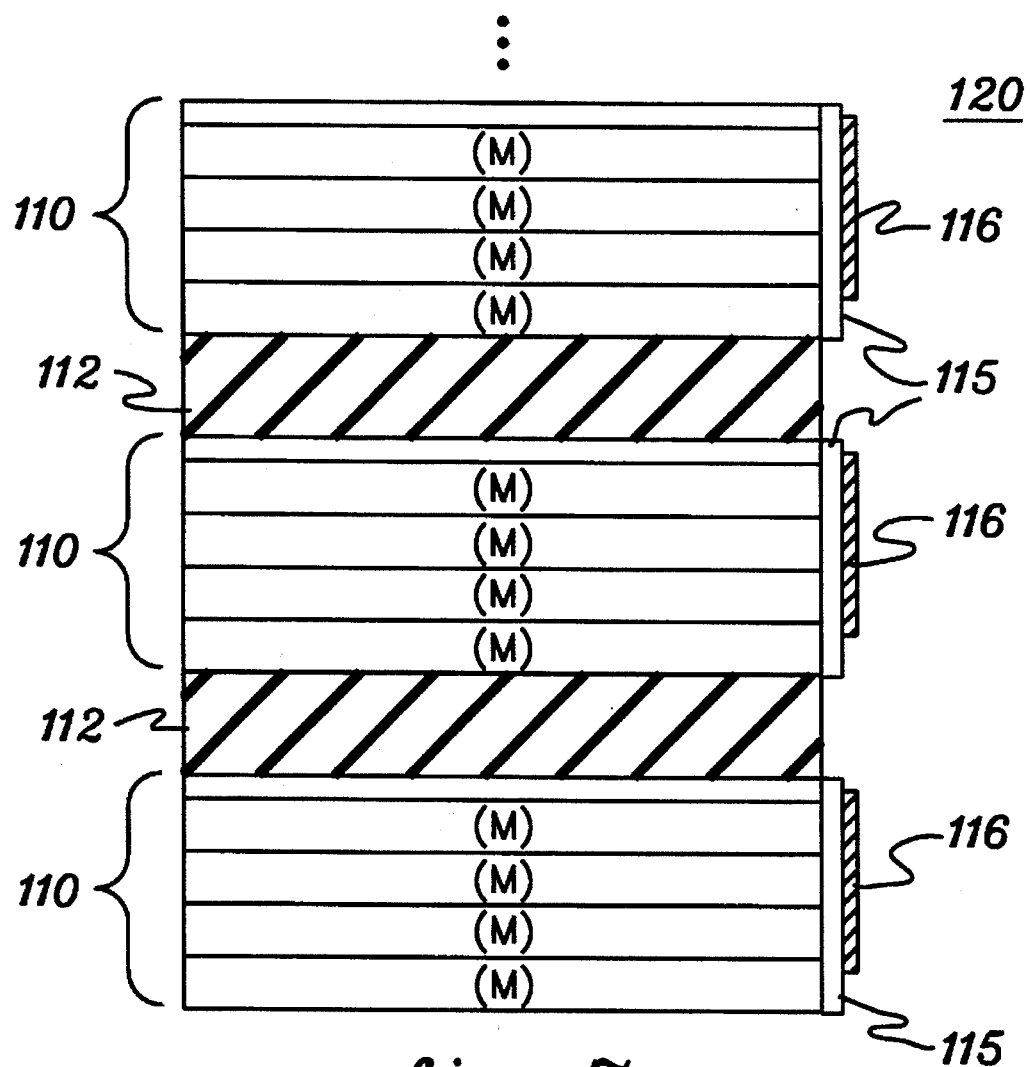
FIG. 7 is an elevational view of one embodiment of multiple subassemblies of FIG. 6 arranged in a single extended stack to facilitate side surface metallization processing of each subassembly in accordance with a fabrication technique pursuant to the present invention.

Referring to FIG. 6, a preferred processing approach is to produce multiple memory subassemblies 110 comprising stacked memory chips 114 and a preformed electrical interface layer 118, for example, fabricated of Upilex flex. As shown in FIG. 7, these memory subassemblies are produced by stacking and laminating the individual components (114 and 118) in the preferred configuration. Segmentation layer 112 (e.g., parylene), interposed between memory subassemblies 110, is incorporated into stack 120 to facilitate segmentation of the subassemblies. Side face processing is comprised of insulation layer 115 and metallization layer 116. Once side surface metallization is complete, the subassemblies are segmented and cleaned. A logic chip is then mechanically and electrically connected to each subassembly. The resulting assembly of logic chip, memory chips and Upilex flex comprises the functional portion of the multichip memory module. As discussed, this assembly can then be packaged using standard plastic encapsulation technology currently used for single memory chips.

Thus, multichip memory module fabrication is subdivided into five basic process sectors: (1) wafer-level processing where the transfer metal, polyimide passivation, and Thermid® polymer (trademark of National Starch and Chemical Co.) are deposited/applied onto the memory chips still in wafer form; (2) dice and lamination processing where the wafers are diced into individual chips, then stacked and laminated into a cube format (FIG. 7) with upper layers of Upilex flex 118 and a parylene segmentation polymer 112; (3) cube-level processing where thin-film deposition occurs on at least one side face of a subassembly; (4) attachment and interconnection of the logic chip, memory chip subassembly and lead frame; and (5) plastic encapsulation of this assembly. This last sector results in the electrical interconnection of the individual memory chips and fabrication of a functional integrated multichip memory module.

For this example, the advantage behind the use of the electrical interface layer and wiring is to separate the 16 Mb wiring and the 64 Mb wiring, therefore eliminating potential wiring blockage or congestion problems. This is accomplished by having the 64 Mb wiring (which connects to the lead frame using wirebond interconnections) on top of the flex for both wirebond and solder bump embodiments and the 16 Mb wiring, connected to the memory chip wiring on at least one side surface of the stack using T-connect technology, on the bottom. Both the 64 Mb wiring and the 16 Mb wiring are connected to the logic chip which is attached to the top of the electrical interface layer. The 16 Mb wires are brought to the top of the flex using metallized throughholes or vias.

A "flex" or more specifically, flex circuitry, is comprised of a film, usually a polymer film, onto which patterned metallurgy is deposited. The metallurgy can be deposited on the top, the bottom, or both the top and bottom surfaces. Interconnection between the top and bottom surface metallurgy is achieved using metallized throughholes or vias. The resultant electrical interconnection metallurgies are referred to herein as a metallization pattern.

Upilex is the trade name of a class of commercially available polyimide films manufactured by UBE Industries, Inc. Upilex-S is a preferred one of these films. The specific polyimide used in Upilex-S films is BPDA-PDA, poly-(bisphenyldianhydride-para-phenyldiamine). See the incorporated application for a detailed discussion and references on the preparation and properties of BPDA-PDA polyimide. There are a number of commercially available polyimide-based alternatives to Upilex-S that satisfy the technology needs of the present invention, including: Upilex-R (UBE Industries, Inc. trademark for a BPDA-ODA [poly(bisphenyldianhydride-oxydianiline]) film, Kapton-H (E. I. DuPont de Nemours & Co. trademark for a PMDA-ODA [pyromelliticdianhydride-oxydianiline]) film, and Kapton-E (E. I. DuPont de Nemours & Co. trademark). As can be seen, there is a wide range of candidate materials that can be used.

Further, one need not be restricted to just using polymer-based flex circuitry. Alternatives that will accomplish the same function include: ceramic substrates with either thick-film or thin-film surface wiring, AlN substrates with either thick-film or thin-film surface wiring, and insulated Si with thin-film surface wiring. Flex circuitry is the preferred embodiment, however, because it meets the technology requirements and is relatively inexpensive.

With reference to the segmentation material, parylene is the generic name for a family of polymers developed by Union Carbide. They are typically prepared by vacuum pyrolysis of cyclic di-paraxylenes and their derivatives. According to a preferred fabrication process, parylene deposition occurs after flex metal deposition. Note that it is unnecessarily restrictive to limit the present process to only having parylene as the segmentation material. The technology requirements for this material are:

1. a sufficient adhesive strength to "hold" multichip subassemblies together for side surface processing;

2. an ability to withstand side surface processing temperatures;

3. an ability to withstand side surface processing environments and solvents;

4. segmentability, i.e., allows segmentation of stacked cube subassemblies at a temperature below approximately 400° C. (essentially it must be a material that goes through an appropriate phase transition below 400° C.); and 5. an ability to remove the material from the top surface of the electrical interface layer to attain an acceptable die attach (if the logic chip is wirebonded) or solder bump interconnect (if the logic chip is C4 attached), an acceptable lead frame wirebond attachment, and an acceptable lead frame attachment. Removal methods include: thermal decomposition, plasma etching, $O_2$ ashing, wet etching, and solvation. The specific method used depends upon the type and properties of segmentation material.

Parylene is a material that meets these requirements, but there are other candidate materials that may also meet them, including: poly(alpha methyl styrene) and poly(methylmethacrylate). In addition, there are a large number of materials grouped together under the name of thermoplastics from which one can choose specific materials that meet these requirements. Several of these thermoplastics are also commercially available.

The basic approach to segmentation is one where the temperature of the stack is elevated to a point for which a phase transition in the segmentation material occurs and a shear force is applied to the subunit. Another approach would be one for which the temperature of the cube is lowered to a point where the mechanical properties of the segmentation material are altered such that facile segmentation is possible. One can envision the limit of this being a cryogenic separation process where the temperature is lowered to a point that the segmentation material becomes extremely brittle and the cube literally falls apart into the constituent subunits. Therefore, effective segmentation can occur over a wide range of temperatures depending upon the specific properties of the segmentation material.

Depending upon the specific segmentation material used, the method of application will vary. As noted, parylene requires vacuum pyrolysis. Other easier and less costly candidate methods might employ: liquid dispense, spin apply, paste dispense, and/or paste screening.

With the above overview, one specific multichip memory module fabrication sequence is to:

1. Align and stack memory chips and Upilex flex with parylene per FIGS. 5 & 7;

2. Laminate this assembled structure using elevated pressure and temperature;

3. Polish at least one side surface exposing the transfer metallurgy leads of the individual memory chips;

4. Preferentially etch back the Si from the polished side surface(s) such that the transfer metallurgy leads extend above the surface defined by the etched Si;

5. Prepare at least one side surface for polyimide (PI), apply and cure
   a. O$_2$ plasma etch cube face
   b. Apply adhesion promoter
      currently an aminopropylsilane
      spin apply and dry
   (both of those steps are important, but are not absolutely required for this technology);

6. Apply and cure the side surface polyimide
   current PI is PMDA-ODA
   many polyimides can be used (see the incorporated application),
   currently polyamic acid PI precursor is spun applied to the cube face and oven cured to 350° C. in a N$_2$-atmosphere;

7. Polish the side surfaces(s) to expose the transfer metallurgy leads;

8. Deposit cube face metallurgy
   a. define thin-film pattern using standard photolithograhic techniques
      each memory subassembly in the large stack is treated independently from a photolithographic standpoint; therefore, memory subassembly stacking tolerances are not critical;

9. Subunit segmentation
   a. cut cube face polyimide layer along parylene segmentation layer
      current technique: scalpel
      alternatives include: etching a trench and laser ablating a trench,
   b. separate subunit from cube stack
      current technique: precision shearing of each subunit at elevated temperature,
      if parylene, more specifically parylene-N, is the segmentation polymer then the segmentation must occur above glass transition temperature (50°–80° C.) and preferably above its melting point (approx. 230° C.),
      and alternative to parylene-N is parylene-C which has a glass transition temperature of 80° C. and a melting point of approx. 290° C.

10. Remove residual segmentation material from flex for each subunit
    elevate parylene above its thermal decomposition temperature (parylene-N: 320° C., parylene-C 400° C.)
    O$_2$ plasma etch flex surface
    during thermal decomposition temperature an anneal of the T-connect metallurgy is also achieved; and 11. Attach logic chip to flex:

I. Option 1: Wirebond Interconnection—preferred embodiment attach process whereby a joining material is used to attach the backside of the chip to the flex. There are many standard die attach materials available that will work, including: Si-Ag brazed and high temperature polymers, e.g., JM-7000. Electrical connection is done by ultrasonically (or thermosonically) bonding a wire between the chip I/O pad metal and top-side metallurgy pads on the electrical interface layer and/or lead frame. All 16 Mb wiring between the logic chip and electrical interface layer is interconnected using wirebonding.

There are two options for the 64 Mb wiring connections. First, wirebond could be employed directly between logic chip I/O and the lead frame (which is preferred) or wirebond could be employed between logic chip I/O and a 64 Mb top-side wiring on the electrical interface layer. This top-side wiring is then electrically connected to the lead frame using a wire. Physical spacing or mechanical tool limitations may require the later option. Wirebond interconnection technology is widely practiced in the microelectronics industry and is familiar to those skilled in the art.

II. Option 2: Solder Bump Interconnection

A solder bump, or equivalently a controlled collapsed chip connection (C4), is employed to mechanically and electrically bond the chip to the electrical interface layer. The chip is flipped, i.e., the back side is positioned to face away from the flex layer and small solder bumps are used to attach logic chip I/O metallurgy to the flex circuit metallurgy. The interconnection is achieved by melting the solder. Because the solder bumps are subjected to fatigue stresses through chip thermal cycles, a C4 encapsulant is often employed to enhance C4 fatigue life. This encapsulant is typically a polymeric material that is applied as a liquid by injecting it under the chip after C4 connection. The material is then cured to form a tough coating that fills the spaces in between the C4's underneath the logic chip. Encapsulant materials are usually epoxy based resins. There are numerous commercially available materials which could be employed, including: HYSOL CNB 520-34 and HYSOL 4322 (from Dexter Corp.) and Sylgard from either MidSil Corp. (as MS 2621) or Dow Corning (as DC 630).

At this point, assembly of the logic chip, electrical interface (flex) layer, and memory chips is completed. The resultant structure is a stand alone functional microelectronic entity that emulates a single integrated circuit memory chip. The last step in the fabrication process is to package this entity. The most common way to package memory chips is to interconnect the chip I/O to a lead frame and then encapsulate the lead frame/chip assembly using plastic, i.e., to form a TSOP or SOJ. The same can be done for an assembled structure in accordance with the present invention. Industry standard practices and materials for lead frame attachment, wirebond interconnection, and plastic encapsulation, using injection molding techniques, can be used to package this assembly.

If the logic chip is connected to the memory subunit using solder bump or C4 technology, then because of injection molding pressures and temperatures, special care must be taken to ensure that the solder bumps are not compressed and plastically deformed. As noted above, this could be achieved in a number of ways including: (1) solder bump encapsulation, using an epoxy resin material; (2) providing standoffs on the bottom of the chip so that the chip and solder bumps would be supported during injection molding; or (3) employing a solder that is resistant to compression and plastic deformation, i.e., one having high strength. Once encapsulated, fabrication and packaging of the integrated multichip memory module is complete.

As set forth above, there are a number of inherent advantages in the integrated multichip memory module structure and fabrication approach of the present invention. The resultant structure emulates a next generation memory chip using readily available existing generation memory chips. Further, a module can have physical dimensions smaller than industry standards for an initial next generation memory chip. Wiring interfaces between existing and next generation buses can be contained in a preformed electrical interface layer which can be manufactured and tested separately. Logic chip transfer metallurgy to a side of the structure is eliminated, thereby correspondingly eliminating any special processing and testing for the logic chip. Testing and burn-in of the logic chip, memory chip assembly and preformed electrical interface layer can be conducted separately, thereby identifying a potential defect at a lower level of assembly. The controlling logic chip can reside entirely within an inner opening in the lead frame. Further, any number of semiconductor chips can be employed within a module's stack. The number employed depends upon the memory chip architecture selected and the memory module architecture desired.

An alternative, more complex, multichip memory module that exploits the advantages of the present invention would be one having two or more logic chips attached to the preformed layer above the memory subassembly. Further, it is possible to have two or more logic chips in combination with decoupling capacitors, terminating resistors or other components disposed within the lead frame opening. As described above, wirebonding could directly connect the logic chips and the lead frame, or multiple wirebond loops to one or more interconnection pads could be employed.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. An integrated multichip memory module which emulates to external circuitry a single chip memory architecture, said integrated multichip memory module comprising:

a memory subunit having N memory chips (wherein $N \geq 2$), each memory chip of the memory subunit having M memory devices (wherein $M \geq 2$), along with two substantially parallel planar main surfaces and an edge surface, at least one planar main surface of each memory chip being coupled to a planar main surface of an adjacent memory chip of the memory subunit such that said memory subunit has a stack structure; and logic means electrically connected to each of the N memory chips for coordinating external circuitry communication with said N memory chips of said memory subunit such that an integrated memory architecture with said N×M memory devices exists which appears to said external circuitry to comprise said single chip memory structure with N×M memory devices; and wherein said memory subunit further includes a logic chip, said logic chip having two substantially parallel planar main surfaces, one of said planar main surfaces of said logic chip being coupled to a planar main surface of an adjacent memory chip of the memory subunit, said logic chip being separate from said logic means.

2. An integrated multichip memory module which emulates to external circuitry a single chip memory architecture, said integrated multichip memory module comprising:

a memory subunit having N memory chips (wherein $N \geq 2$), each memory chip of the memory subunit having M memory devices (wherein $M \geq 2$), along with two substantially parallel planar main surfaces and an edge surface, at least one planar main surface of each memory chip being coupled to a planar main surface of an adjacent memory chip of the memory subunit such that said memory subunit has a stack structure; and logic means electrically connected to each of the N memory chips for coordinating external circuitry communication with said N memory chips of said memory subunit such that an integrated memory architecture with said N×M memory devices exists which appears to said external circuitry to comprise said single chip memory structure with N×M memory devices; and wherein the logic means comprises at least two logic chips mechanically coupled to the memory subunit.

3. An integrated multichip memory module which emulates to external circuitry a single chip memory architecture, said integrated multichip memory module comprising:

a memory subunit having N memory chips (wherein $N \geq 2$), each memory chip of the memory subunit having M memory devices (wherein $M \geq 2$), along with two substantially parallel planar main surfaces and an edge surface, at least one planar main surface of each memory chip being coupled to a planar main surface of an adjacent memory chip of the memory subunit such that said memory subunit has a stack structure; and logic means electrically connected to each of the N memory chips for coordinating external circuitry communication with said N memory chips of said memory subunit such that an integrated memory architecture with said N×M memory devices exists which appears to said external circuitry to comprise said single chip memory structure with N×M memory devices; and wherein the logic means includes non-semiconductor type devices coupled to said memory subunit.

4. A multichip integrated circuit package comprising:

a plurality of semiconductor chips of similar dimensions coupled together in a stack having an end surface and at least one side surface;

a lead frame secured to the stack at its end surface, said lead frame having an inner opening extending therethrough such that a portion of the stack's end surface remains exposed;

a semiconductor chip of smaller dimensions than the similar dimensions of the plurality of semiconductor chips forming the stack, the semiconductor chip of smaller dimensions residing within the inner opening of the lead frame and being secured to the portion of the stack's end surface remaining exposed; and metallurgy means for electrically interconnecting the plurality of semiconductor chips forming the stack, the semiconductor chip of smaller dimensions and the lead frame such that a dense multichip integrated circuit package is defined from semiconductor chips having different dimensions.

5. The multichip integrated circuit package of claim 4, wherein each semiconductor chip of said plurality of semiconductor chips comprises one of a logic chip, a memory chip, and a combination memory and logic chip.

6. The multichip integrated circuit package of claim 4, wherein said semiconductor chip of smaller dimensions includes communication means for coordinating communication between said plurality of semiconductor chips and external circuitry.

7. The multichip integrated circuit package of claim 4, wherein each semiconductor chip of said plurality of semiconductor chips has planar surfaces and a rectangular shape with four side surfaces, and wherein said lead frame also has planar surfaces and a rectangular shape with four side surfaces, the side surfaces of said lead frame being coplanar to the sides surfaces of the plurality of semiconductor chips coupled together in said stack, wherein said multichip integrated circuit package is parallelepiped.

8. The multichip integrated circuit package of claim 4, wherein said lead frame has a first upper surface and wherein said semiconductor chip of smaller dimensions has a second upper surface, said second upper surface being spaced from the stack's end surface at least as far as said first upper surface is spaced from said stack's end surface.

9. The multichip integrated circuit package of claim 8, wherein said first upper surface and said second upper surface are coplanar.

10. The multichip integrated circuit package of claim 4, wherein said metallurgy means includes a plurality of transfer metallurgies electrically connected to said plurality of semiconductor chips, each transfer metallurgy being connected to one of said semiconductor chips of said plurality of semiconductor chips and extending to the at least one side surface of said stack, and wherein said metallurgy means further includes a first metallurgy pattern disposed on the at least one side surface of the stack, said first metallurgy pattern interconnecting said transfer metallurgies extending to the at least one side surface of the stack such that the plurality of semiconductor chips are electrically interconnected.

11. The multichip integrated circuit package of claim 10, wherein said metallurgy means further includes an electrical interface layer connected to the end surface of said stack between said stack and said lead frame, said electrical interface layer including a second metallurgy pattern, said second metallurgy pattern electrically connecting with said first metallurgy pattern on the at least one side surface of the stack.

12. The multichip integrated circuit package of claim 11, wherein said electrical interface layer has two substantially parallel planar main surfaces and an edge surface, one of said substantially parallel planar main surfaces of said electrical interface layer comprising a lower main surface and the other main surface of said two substantially parallel planar main surfaces comprising an upper main surface, and wherein said second metallurgy pattern includes a lower surface layer of interconnect metallurgy extending to said at least one side surface having said first metallurgy pattern disposed thereon, and an upper surface layer of interconnect metallurgy, said upper surface layer of interconnect metallurgy electrically connecting with said semiconductor chip of smaller dimensions, said electrical interface layer further including metallized throughholes extending between said substantially parallel planar main surfaces to electrically interconnect said lower surface layer of interconnect metallurgy and said upper surface layer of interconnect metallurgy.

13. The multichip integrated circuit package of claim 11, wherein said second metallurgy pattern electrically connects with said semiconductor chip of smaller dimensions such that the semiconductor chip of smaller dimensions and the semiconductor chips of similar dimensions forming the stack are electrically interconnected.

14. The multichip integrated circuit package of claim 13, wherein said second metallurgy pattern electrically connects with said semiconductor chip of smaller dimensions via one of solder bumps and conventional wirebonding without use of T-connect on the semiconductor chip of smaller dimensions.

15. The multichip integrated circuit package of claim 13, wherein said metallurgy means further includes wirebonding electrically interconnecting said lead frame and said semiconductor chip of smaller dimensions.

16. An integrated multichip memory module comprising:

N memory chips (wherein N≧2) each having M memory devices (wherein M≧2), each memory chip also having two substantially parallel planar main surfaces and an edge surface, said N memory chips being stacked together to form a subunit having at least one side surface and an end surface, the at least one side surface of the subunit being defined by the edge surfaces of the N memory chips, and the end surface of the subunit extending parallel to the planar main surfaces of the N memory chips forming the subunit, at least some of said N memory chips including transfer metallurgy extending to the at least one side surface of the subunit;

a first metallization pattern disposed on said subunit's at least one side surface and electrically connecting with the transfer metallurgy extending to the at least one side surface of the subunit;

an electrical interface layer disposed adjacent to the end surface of the subunit, said electrical interface layer having two substantially parallel planar main surfaces and an edge surface, one of said substantially parallel planar main surfaces of said electrical interface layer being coupled to the end surface of the subunit, the edge surface of the electrical interface layer aligning with the at least one side surface of said subunit, said electrical interface layer having a second metallization pattern disposed therethrough, said second metallization pattern electrically connecting with said first metallization pattern on the at least one side surface of the subunit; and a logic chip mechanically coupled to an exposed planar main surface of the electrical interface layer and electrically connected to said second metallization pattern such that said logic chip is electrically connected to the memory chips having said transfer metallurgy extending to the at least one side surface of the subunit through said first and second metallization patterns, said logic chip including means for coordinating external communication with said N memory chips of said subunit.

17. The integrated multichip memory module of claim 16, wherein the memory module communicates with a memory controller, said memory controller providing an address signal to said logic chip, and wherein said logic chip includes logic means for decoding the address signal to identify a particular memory chip of said N memory chips in said subunit having the memory device addressed by the address signal.

18. The integrated multichip memory module of claim 16, wherein said logic chip includes logic means for sequentially refreshing each of said N memory chips of the subunit.

19. The integrated multichip memory module of claim 18, wherein said logic means for sequentially refreshing includes a counter connected for sequentially tracking refreshing of each of said N memory chips of said subunit.

20. The integrated multichip memory module of claim 16, wherein the memory module communicates with a memory controller, and wherein said logic chip further includes logic means for initiating a sleep mode within each of said N memory chips of the subunit in response to a sleep command received from the memory controller.

21. The integrated multichip memory module of claim 16, wherein said logic chip further includes voltage regulation means for transforming a received voltage to an on-chip voltage for powering said logic chip.

22. The integrated multichip memory module of claim 16, further comprising a lead frame having a central opening extending therethrough sufficiently sized to accommodate said logic chip therein, said lead frame being coupled to said electrical interface layer such that said logic chip is surrounded by said lead frame, said lead frame facilitating external electrical connection to said logic chip.

23. The integrated multichip memory module of claim 22, wherein N equals four and wherein each of said four memory chips comprises a RAM chip.

24. The integrated multichip memory module of claim 23, wherein said second metallization pattern electrically connects with said logic chip via one of solder bumps and conventional wirebonding without use of T-connects on the logic chip.

25. The integrated multichip memory module of claim 24, wherein said lead frame and said logic chip are electrically interconnected via conventional wirebonding.

26. The integrated multichip memory module of claim 16, further comprising a lead frame electrically connected to said integrated multichip memory module, said lead frame facilitating external electrical connection to said logic chip.

* * * * *

UNITED STATES PATENT AND TRADEMARK OFFICE
CERTIFICATE OF CORRECTION

PATENT NO.   : 5,502,667
DATED        : Mar. 26, 1996
INVENTOR(S)  : Bertin et al.

It is certified that error appears in the above-indentified patent and that said Letters Patent is hereby corrected as shown below:

In the Claims:

Column 17, line 9, delete "23" and substitute therefor --22--.

Signed and Sealed this

Twentieth Day of August, 1996

Attest:

BRUCE LEHMAN

Attesting Officer    Commissioner of Patents and Trademarks